RETAINER FOR PRINTED CIRCUIT BOARDS

Filed Nov. 23, 1962

INVENTOR.
RODNEY L. MACK
ARNOLD M. WEISMAN

BY R. E. Geauque

ATTORNEY 3,186,554
Patented June 1, 1965

3,186,554

RETAINER FOR PRINTED CIRCUIT BOARDS

Rodney L. Mack, Temple City, and Arnold M. Weisman, Los Angeles, Calif., assignors to The Birtcher Corporation, Los Angeles, Calif., a corporation of California Filed Nov. 23, 1962, Ser. No. 239,465
6 Claims. (Cl. 211—41)

This invention relates to a retainer for printed circuit boards and more particularly to a retainer device which grips the edge of a printed circuit board and secures the board to a support structure.

It is presently the practice to fasten retainers of this type along opposite edges of a printed circuit board and to secure these retainers to the casing or housing in which the printed circuit board is located. However, in some prior retainers, the board is centrally mounted resulting in the disadvantage that it is difficult to mount the board closely adjacent a housing structure. In the present invention, the board is offset in the retainer to permit such closer mounting and also, the board can be inserted from either end of the retainer so that the retainer can be used in any orientation with the board placed either closely adjacent the structure or spaced substantially therefrom. Also, the retainer of the present invention has a substantially rigid engaging surface on one side of the board and a more flexible engaging surface on the other side of the board to minimize movement of the board under vibration, since the spring force of the more flexible surface tends to always push the board against the more rigid surface. The upper edges of the engaging surfaces are flared outwardly so that it is possible to load the printed circuit board from the top of the retainer by pressing the edge of the board downwardly into the space between engaging surfaces. In some prior devices, top loading is impossible because the engaging surfaces slant inwardly towards one another and any downward loading force on the edges of the engaging surfaces moves the surfaces downwardly but not apart.

It is therefore an object of the present invention to provide a retainer for printed circuit boards which engages an edge of the board and supports the board in an offset relationship in order to permit the board to be placed closely to a housing wall or other structural member.

Another object of the present invention is to provide a retainer for printed circuit boards which is fabricated from a single strip of metal and has the board engaging surfaces offset from the center line of the retainer so that the supporting rivets passing through the retainer can be located at one side of the board.

A further object of the present invention is to provide a retainer for printed circuit boards which is provided with opposed surfaces between which the edge of the board can be inserted from either end of the retainer.

Another object of the invention is to provide spring surfaces for engaging opposite edge surfaces of a printed circuit board, one of said surfaces being substantially more rigid than the other so that the spring force of the more flexible one holds the board against the more rigid one in order to cut down movement of the board under vibration.

Another object of the invention is to provide a retainer for printed circuit boards into which the board can be top loaded.

These and other objects of the invention not specifically set forth above will become readily apparent from an accompanying description and drawings in which.

Figures 1, 4, 5:
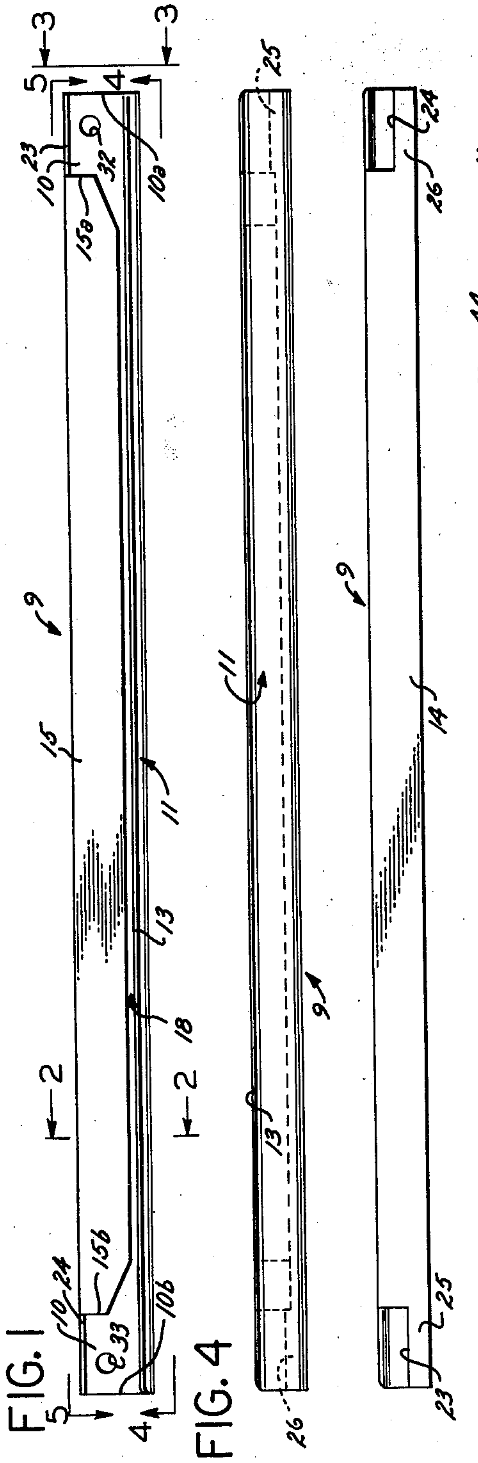
FIGURE 1 is a top plan view of the printed circuit board retainer of the present invention illustrating the space between the board engaging surfaces and the rivet mounting holes located at the ends of the retainer.
FIGURE 4 is a side elevational view taken along lines 4—4 of FIGURE 1.
FIGURE 5 is a side elevational view taken along lines 5—5 of FIGURE 1.

One embodiment of retainer 9 is illustrated as having a bottom panel 10 connected at one edge with an upturned panel 11 having an inner board engaging surface 12. The panel 11 is formed by bending over the edge of bottom panel 10 by more than 90° so that panel 11 has substantial rigidity and the surface 12 is angularly positioned with respect to the bottom panel 10. The upper edge 13 of panel 11 is rolled backwards to provide a reverse lip for guiding the circuit board during top loading. The other edge of panel 10 is connected with a side panel 14 which supports a top panel 15. A downturned panel 16 depends from panel 15 and provides a second board engaging surface 17 which is substantially perpendicular to bottom panel 10 since panels 14, 15 and 16 are formed by successive right angle bends. Surfaces 12 and 17 are normally spaced apart to form a slot 18 into which the circuit board 20 is inserted. The side panel 14 is cut along the edges 23 and 24 to provide small lips 25 and 26, respectively, at opposite ends 10*a* and 10*b* of the panel 10. Also, the ends 15*a* and 15*b* of the top panel are displaced inwardly from the ends 10*a* and 10*b*, respectively, of the bottom panel 10. The corners 30 and 31 of downturned panel 16 are folded back to form slanted end guides for the printed circuit board so that an edge of the board can be slid into slot 18 from either end of the retainer 9. Rivet holes 32 and 33 are placed in ends 10*a* and 10*b*, respectively, of the bottom panel 10 which are not covered by top panel 15 so that the rivet holes are accessible, and the holes are offset from slot 18 so that the rivets will not interfere with the mounting of the circuit board.

Figures 2, 3, 6:
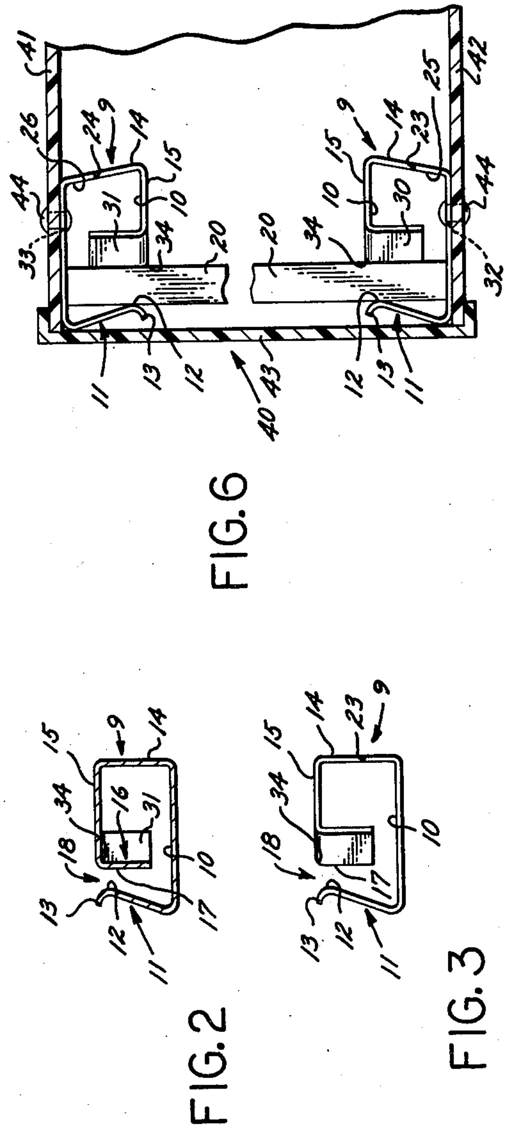
FIGURE 2 is a vertical section along lines 2—2 of FIGURE 1 showing the surfaces which engage opposite edge surfaces of the circuit board.
FIGURE 3 is an end elevational view taken along lines 3—3 of FIGURE 1 illustrating the bent ends on one of the engaging surfaces to permit insertion of the board from either end of the retainer.
FIGURE 6 is a sectional view showing the manner in which two retainers of the present invention secure a printed circuit board closely adjacent the wall of a housing.

The width of the slot 18 between the board engaging surfaces 12 and 17 in FIGURES 2 and 3 is less than the thickness of the printed circuit board which is to be inserted within the slot. For example, a 1/16" thick printed circuit board would be mounted in a slot 18 approximately 0.02 inches less in width than the circuit board. When the printed board is inserted from either end, it is guided by one of the corners 30, 31 into slot 18 and the board spreads the surfaces 12 and 17 apart as the edge of the board is forced completely into the slot (see FIGURE 6). As previously stated, since the rivet holes are offset from the slot 18, the heads of the rivets will not interfere with the insertion of the board. Since the engaging surface 17 is on panel 16, which is supported by panels 14 and 15, the surface 17 is considerably more flexible than the surface 12 on the short upturned panel 11. Thus, the surface 17 will have considerably more spring action than surface 12. During vibration, the surface 17 will flex and hold the board against the more rigid face 12 resulting in minimum movement of the board.

The rolled edge 13 and rounded corner 34 between the panels 15 and 16 permit the top insertion of the board into the slot 18. The insertion can be commenced at one end of slot 18 where the surfaces 12 and 17 can be spread apart enough to receive one corner of the board. Thereafter, the edge of the board can be progressively inserted from the top into the slot. In this process, the more flexible surface 17 will be forced downwardly towards the bottom panel 10 before the surface 12 will move sideways to permit the board to enter.

Referring to FIGURE 6, a pair of retainers 9 are mounted in the corners of a housing 40 having side panels 41, 42 and end cover 43. By placing the side panel 11 adjacent to cover 43, the printed circuit board can be placed closely adjacent to the cover 43 and rivets 44 can be placed in rivet holes 32 and 33 of each retainer for attachment to the sides 41 and 42 without interference from the printed circuit board. The board 20 is inserted into the slots 18 in each of the retainers from the top edges in FIGURE 6. In the event it is desired to place the board 20 further away from the cover 43, the retainers can be mounted with the panel 14 adjacent the cover and slots 18 spaced a maximum distance from the cover.

By the present invention there is provided a novel retainer for printed circuit boards which can be fabricated from a single sheet of spring metal by suitable bending operations. It is apparent that the relationship of the various panels and the shaping thereof can be varied while still providing engaging surfaces capable of accomplishing the desired retaining functions. Various other modifications are contemplated by those skilled in the art without departing from the spirit and scope of the invention as hereinafter defined by the appended claims.

What is claimed is:

1. A retainer for retaining a printed circuit board by receiving an edge thereof comprising:

a flat bottom mounting panel, a single upturned panel along one edge thereof having a first board engaging surface;

a second upturned panel along the other edge of said mounting panel supporting a flat top panel extending toward said single panel and substantially parallel to said mounting panel;

a downturned panel attached at the edge of said top panel nearest said single panel and having a second board engaging surface and located opposite said first surface;

a board receiving slot located between said first and second surfaces, said slot normally having less width than the thickness of said board so that upon insertion of said board within said slot said surfaces are spread apart slightly and firmly engage the surface of said board with a spring force.

2. A device as defined in claim 1 wherein:

said mounting panel has end portions extending beyond each end of said top panel; and rivet mounting holes in said end portions displaced from the plane of said slot.

3. A device as defined in claim 1 wherein:

said single upturned panel makes an angle of less than 90 degrees with said bottom panel on the side of said first surface to provide for rigidity of said panel;

said second panel and top panel providing said downturned panel with substantially more flexibility than said single upturned panel.

4. A device as defined in claim 3 wherein:

the upper edge of said single upturned panel is rolled over to permit top insertion of the edges of said board into said slot.

5. A device as defined in claim 3 wherein:

said second upturned panel is substantially perpendicular to said bottom mounting panel and said top panel is substantially perpendicular to said second upturned panel;

said downturned panel being substantially perpendicular to said top panel.

6. A device as defined in claim 1 wherein:

said downturned panel has its ends flared away from said slot to enlarge said slot in order to guide the edge of a board into said slot.

References Cited by the Examiner

UNITED STATES PATENTS

| | | | |
|---|---|---|---|
| 2,092,681 | 9/37 | Reilly | 24—259 X |
| 2,518,053 | 8/50 | O'Bryan et al. | 312—35 |
| 2,844,259 | 7/58 | Haines | 211—16 |
| 2,948,940 | 8/60 | Degener | 24—259 X |
| 2,995,795 | 8/61 | Samson | 24—259 |
| 3,089,211 | 5/63 | Perusse | 24—259 |

CLAUDE A. LE ROY, *Primary Examiner.*